US005595927A

United States Patent [19]
Chen et al.

[11] Patent Number: 5,595,927
[45] Date of Patent: Jan. 21, 1997

[54] METHOD FOR MAKING SELF-ALIGNED SOURCE/DRAIN MASK ROM MEMORY CELL USING TRENCH ETCHED CHANNEL

[75] Inventors: Ling Chen, Sunnyvale, Calif.; Hung-Cheng Sung, Kaohsinng; Chi-Shiung Lo, Hsinchu, both of Taiwan

[73] Assignee: Taiwan Semiconductor Manufacturing Company Ltd., Hsin-Chu, Taiwan

[21] Appl. No.: 405,722

[22] Filed: Mar. 17, 1995

[51] Int. Cl.$^6$ ................................ H01L 21/70
[52] U.S. Cl. ..................... 437/52; 437/40; 437/41; 437/203
[58] Field of Search .............. 437/52, 53, 40 SW, 437/41 SW, 203; 148/DIG. 106

[56] References Cited

U.S. PATENT DOCUMENTS

| 5,180,680 | 1/1993 | Yang | 437/203 |
|---|---|---|---|
| 5,183,774 | 2/1993 | Satoh | 437/203 |
| 5,196,368 | 3/1993 | Thompson et al. | 148/DIG. 106 |
| 5,244,824 | 9/1993 | Sivan | 437/52 |
| 5,429,973 | 7/1995 | Hong | 437/203 |
| 5,460,988 | 10/1995 | Hong | 437/52 |
| 5,488,009 | 1/1996 | Hsue et al. | 437/52 |

Primary Examiner—Kevin Picardat
Attorney, Agent, or Firm—George O. Saile; Graham S. Jones, II

[57] ABSTRACT

A device and a method are provided for manufacture of that semiconductor memory device on a silicon semiconductor substrate with a vertical channel. A dielectric layer pattern with openings through it is formed. Trenches are formed in the surface of the semiconductor substrate. The trenches have sidewalls. A spacer layer is formed on the surface of the device. The spacer layer is shaped to form spacers in the trenches on the sidewalls. Source/drain regions are formed by ion implanting ions to deposit dopant into the substrate. The device is annealed to form source/drain regions in the substrate. A dielectric layer is formed over the device. A conductive word-line is formed and patterned over the dielectric layer.

31 Claims, 14 Drawing Sheets

METHOD FOR MAKING SELF-ALIGNED SOURCE/DRAIN MASK ROM MEMORY CELL USING TRENCH ETCHED CHANNEL

BACKGROUND OF THE INVENTION

1. Field of the Invention

This invention relates to semiconductor memory devices and more particularly to vertical ROM devices.

2. Description of Related Art

U.S. Pat. No. 5,244,824 of Sivan for "Trench Capacitor and Transistor Structure and Method for Making the Same" shows a vertical channel memory cell for a DRAM.

Even with a flat type cell, cell size remains large.

SUMMARY OF THE INVENTION

An object of this invention is to reduce the size of the Mask ROM cell to half the size of a flat-cell using the same layout rule.

In accordance with this invention a method is provided for manufacture of a semiconductor memory device on a silicon semiconductor substrate with a vertical channel. A first dielectric layer patterned with a pattern of trench openings therethrough is formed on the substrate. Next trenches are etched in the surface of the semiconductor substrate through the first dielectric layer. As a result of the etching the trenches formed have bases and sidewalls and the substrate has upper surfaces between and/or aside from the trenches. Then a spacer layer is formed on the surface of the device. The spacer layer is shaped to form spacers in the trenches along the sidewalls. Source/drain ions are ion implanted in the substrate to deposit dopant therein. The device is then annealed to form source/drain regions in the silicon semiconductor substrate. A second dielectric layer is formed over the device. A conductive word-line is formed and patterned over the dielectric layer.

Preferably, the trenches are formed by forming a masking silicon dioxide layer on the silicon substrate, forming a photoresist mask on the masking silicon dioxide layer, etching the masking silicon dioxide layer through the mask to form a mask in the masking silicon dioxide layer, and etching of the silicon through the mask formed by the masking silicon dioxide layer to form the trench.

Preferably, the spacers are formed by the steps comprising removing the masking silicon dioxide layer, forming a spacer dielectric layer over the device including the trenches, forming a spacer layer of a material selected from polysilicon and silicon nitride over the spacer dielectric layer, and etching the spacer layer to form the spacers.

It is also preferred that subsequent to formation of the spacers a source/drain self-aligned ion implantation is performed. Subsequent to the source/drain self-aligned ion implantation the spacer layer is removed, and the second dielectric layer is removed so the substrate including the trenches is exposed.

After removing the spacer layer and the second dielectric layer the a gate oxide layer is formed over the device including the trenches.

Subsequent to forming a gate oxide layer over the device including the trenches, anneal the device to drive ion implanted dopant into the source/drain regions of the substrate to form source regions and drain regions therein.

Preferably, source regions extend across beneath the trenches and the drain regions are juxtaposed with the trenches above the ends of the source regions.

The spacers are formed by the steps comprising removing the masking silicon dioxide layer exposing the substrate including the trenches, forming a spacer layer comprising silicon nitride over the the substrate including the trenches, and etching the spacer layer to form the spacers.

Subsequent to formation of the spacers deposit metal on the surface of the device. Preferably, the metal comprises cobalt.

After deposition of the metal on the surface of the device form a silicide from the doped surfaces of the substrate including the surfaces of the trenches with the exception of the surfaces protected by the spacers. Subsequent to formation of the silicide performing a source/drain self-aligned ion implantation.

Preferably, subsequent to the source/drain self-aligned ion implantation remove the spacer, whereby the substrate including the trenches is exposed, and anneal the device to drive in the deposit of ion implanted dopant into the substrate to form source regions and drain regions therein.

Preferably, subsequent to removing the spacer layer and annealing, form a gate oxide layer over the device including the trenches.

Subsequent to forming a gate oxide layer over the device including the trenches, form a gate word line layer over the gate oxide layer.

Preferably the source regions extend across beneath the trenches and the drain regions are juxtaposed with the trenches above the ends of the source regions.

Subsequent to forming and patterning the conductive word-line the steps are performed comprising forming a code implant mask over the word-line layer, and ion implanting through the code implant mask into the device.

In accordance with another aspect of this invention, a semiconductor memory device is formed on a silicon semiconductor substrate with a vertical channel comprising trenches in the surface of the silicon semiconductor substrate. The trenches have sidewalls, ion implanted source/drain regions in the substrate self-aligned with the trenches, a dielectric layer over the source/drain regions, and a conductive word-line over the dielectric layer. The source/drain mask ROM memory cell includes a trench etched channel. The source/drain regions comprises regions annealed into the silicon semiconductor substrate. The source regions extend across beneath the trenches and the drain regions are juxtaposed with the trenches above the ends of the source regions. The source/drain regions include a dopant and a metal silicide formed from a metal and silicon in the silicon semiconductor substrate, which metal preferably comprises cobalt.

The source/drain mask ROM memory cell with a trench etched channel includes a juxtaposed pair of vertical transistors formed on opposite sides of the channel. A ROM code program implant has been ion implanted into the device between a the source region and a the drain region in a selected region of the device. An ion implanted code implant mask is formed in the device. Source/drain regions comprise regions annealed into the silicon semiconductor substrate. Source regions extend across beneath the trenches and the drain regions are juxtaposed with the trenches above the ends of the source regions. The source/drain regions include a dopant and a metal silicide formed from a metal and silicon in the silicon semiconductor substrate. The metal comprises cobalt. The source/drain mask ROM memory cell with a trench etched channel with a juxtaposed pair of vertical transistors formed on opposite sides of the channel. A ROM code program implant has been ion implanted into the device between a the source region and a the drain region in a selected region of the device. An ion implanted code implant mask is formed in the device, comprising a flat structure. The flat structure includes no field oxide structures.

In accordance with a further aspect of this invention, a semiconductor memory device is formed on a silicon semiconductor substrate. The device includes a vertical channel. Trenches are formed in the surface of the silicon semiconductor substrate, the trenches having sidewalls, the trenches including bases, and the substrate including upper surfaces between the trenches. A dielectric layer pattern with openings therein, includes source/drain dopant which has been ion implanted into the bases and the upper surfaces of the substrate and annealed to form source/drain regions in the silicon semiconductor substrate. A second dielectric layer over the device, and a conductive word-line over the dielectric layer. The dielectric layer comprises a gate oxide layer over the device including the trenches.

A source regions extends across beneath the trenches and the drain regions are juxtaposed with the trenches above the ends of the source regions. Metal is deposited on the surface of the source and drain regions has been annealed into a metal silicide in the source/drain regions. The source regions extend across beneath the base of the trenches and the drain regions extend across beneath the upper surfaces, the drain regions being juxtaposed with the trenches above the ends of the source regions.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

This invention provides a Mask ROM memory cell technology employing a process for forming the source and the drain of a device at the same time. In the embodiment of FIGS. 2A–2M, the source/drain regions are silicided to reduce source/drain resistance. There is a flat structure ROM, i.e. no field oxide region in the ROM. In addition, there is one trench for two transistors, i.e. the ROM cell size is reduced to half of a conventional flat cell using the same layout rule.

FIGS. 1A–1L show the process flow for formation of a ROM cell in accordance with the method of this invention. Note that FIGS. 1A–1L show a ROM cell without silicide on the source or the drain, as contrasted with FIGS. 2A–2M, where the source/drain regions are silicided to reduce source/drain resistance.

Figure 1A:
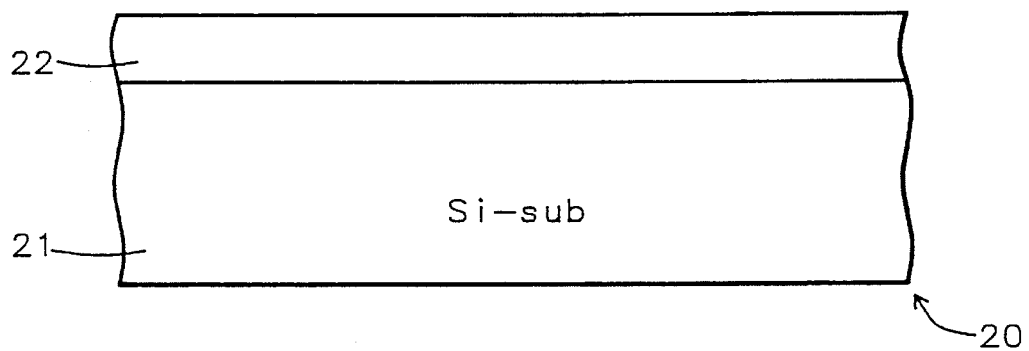
FIGS. 1A–1L show the process flow for formation of a ROM cell in accordance with the method of this invention.

FIG. 1A shows a device 20 in the early stages of manufacture comprising a silicon substrate (Si-sub) 21 on the surface of which an initial dielectric layer in the form of a blanket, masking, silicon dioxide "oxide" layer 22 having a thickness of from about 500 Å to about 3,000 Å, which is formed by the process of (1) dry or wet thermal oxidation and (2) CVD oxide deposition of LTO (Low Temperature Oxide), basically $SiH_4+SiO_2$ or HTO (high temperature oxide, basically $SiH_4$ (or $SiH_2Cl_2$)+$N_2O$.

Figure 1B:
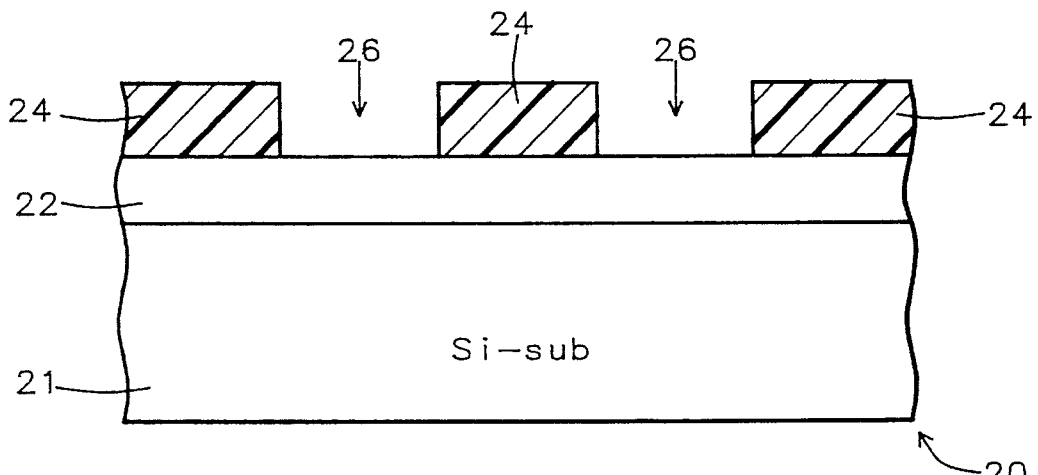

FIG. 1B shows the device of FIG. 1A with a mask 24 with openings 26 therein formed on masking "oxide" layer 26. The mask 24 which is composed of photoresist has been patterned photolithographically with a source/drain pattern by exposure and development in a conventional way. Then the patterned mask 24 is employed to etch away the unwanted portions of layer 22 leaving behind source/drain mask elements of layer 22 below mask 24. The etching of silicon dioxide masking "oxide" layer 22 is performed through openings 26 in mask 24 to form openings 27 in masking layer 22. Openings 27 in masking layer 22 are below openings 26 in mask 24. The etching of masking "oxide" layer 22 is performed by plasma etching using gases such as $C_2F_6$, $CHF_3$ or $CF_4$ as well-known etchants for oxide removal.

After etching, the mask elements 24 are stripped from the device 20 by means of a conventional process for removal of photoresist. The preferred stripping process is preferably plasma stripping (gas of $O_2$) followed by $H_2SO_4/H_2O_2$ cleaning.

Figure 1C:
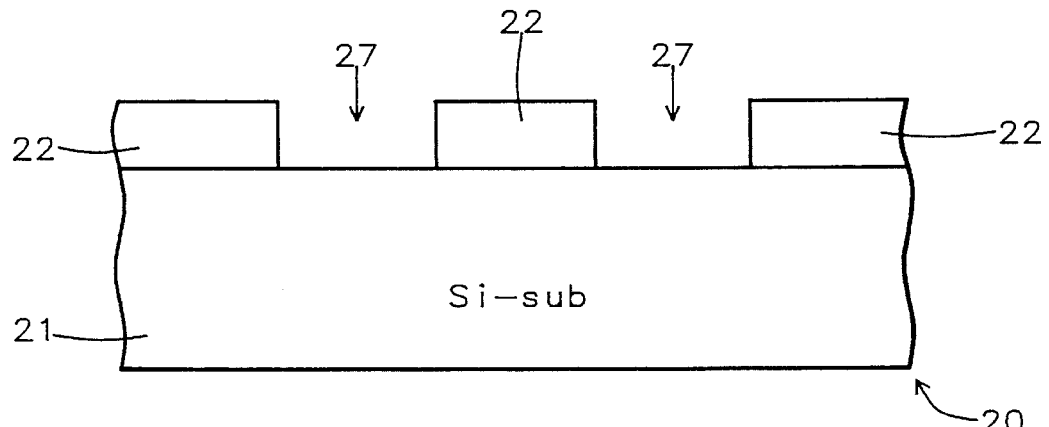

FIG. 1C shows the device of FIG. 1B with the new openings 27 etched in silicon dioxide "oxide" layer 22 and after the stripping of the mask 24.

Figure 1D:
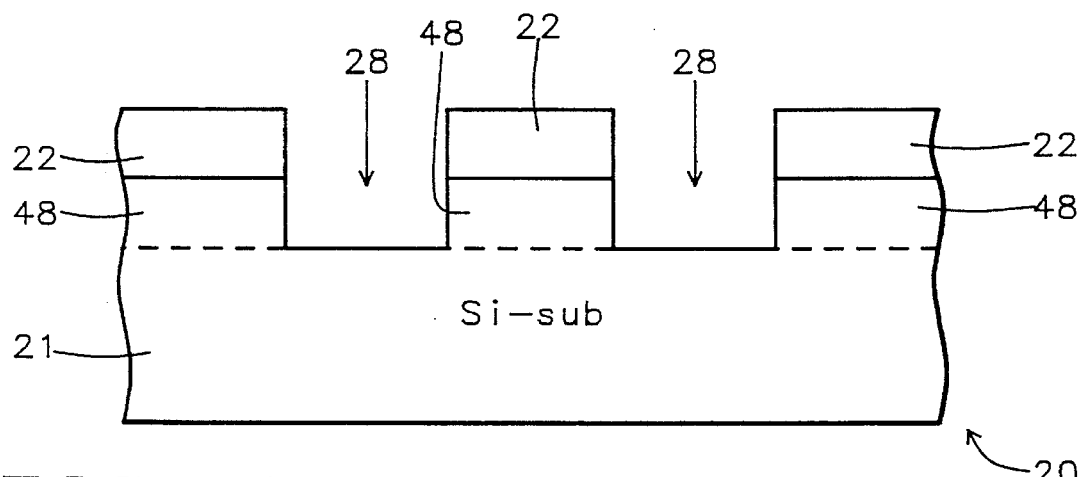

FIG. 1D shows the device of FIG. 1C after "trench" etching of silicon substrate 21 through openings 27 in layer 22 silicon dioxide masking "oxide" layer 22 to form trenches 28 in P-silicon substrate 21 to a depth of from about 3,000 Å to about 15,000 Å. The trenches 28 have vertical sidewalls and a horizontal base parallel to the surface of the substrate 21. The substrate 21 has upper surfaces (the original surfaces of the substrate) between and/or aside from the trenches 28. The etching of P- silicon substrate 21 is performed by plasma etching using a gas such as HBr, or other conventional etchants. After the plasma etching to form trenches 28, wet chemical cleaning is performed using an aqueous solution of acids and alcohol such as $HF/HNO_3/CH_3COOH$ to remove possible contamination or damage introduced by the plasma etching process. Adjacent to the trenches 28 are regions 48 of the substrate 21 which will provide the vertical channels of ROM cells.

Figure 1E:
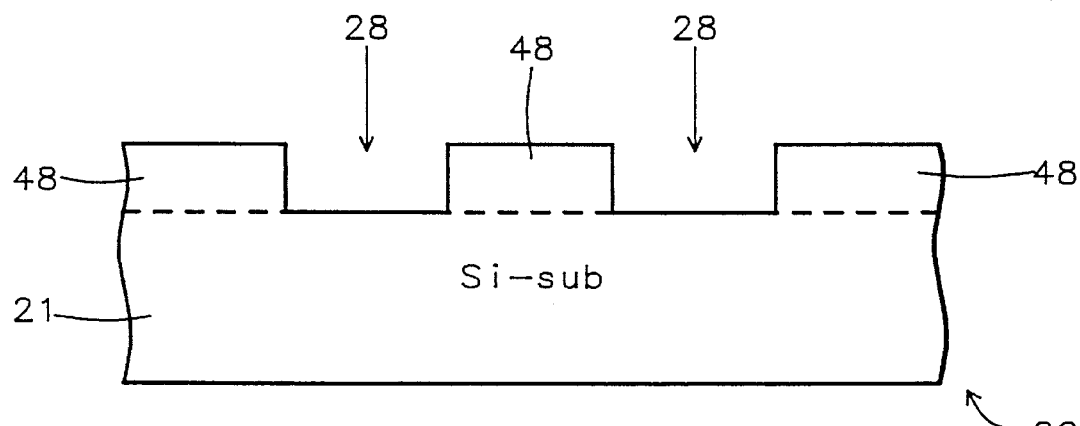

FIG. 1E shows the device of FIG. 1D after removal (stripping) of the remainder of the masking, silicon dioxide "oxide" layer 22, leaving the trenches 28 between the regions 48. This second etching of masking "oxide" layer 22 is performed using wet chemical etching such as HF or BOE (buffered oxide etchant.) In FIG. 1B and FIG. 1C on the other hand, plasma oxide etching was used because a vertical etched profile is needed there and is not necessary in connection with FIG. 1E.

Figure 1F:
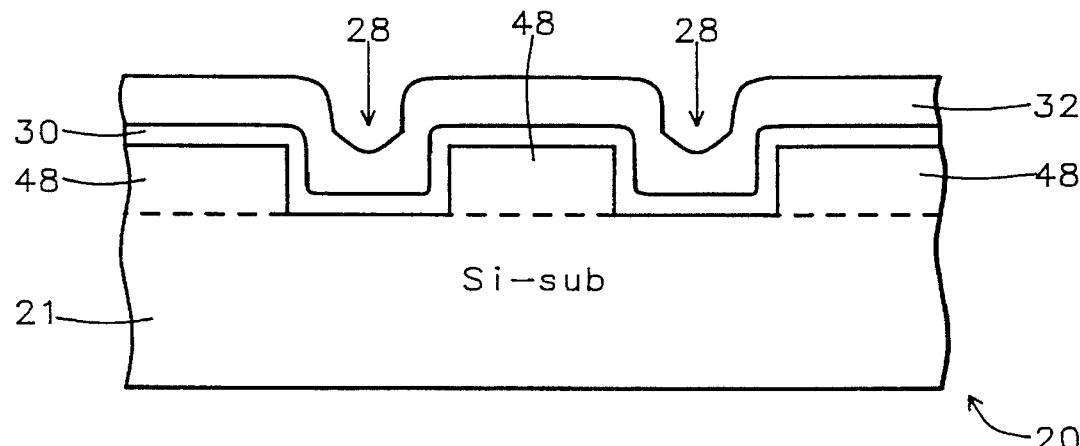

FIG. 1F shows the device of FIG. 1E after formation of a sub-spacer dielectric layer 30 (which underlies the spacer layer to follow.) The sub-spacer layer comprises a silicon dioxide "oxide" layer 30 having a thickness of from about 200 Å to about 1,000 Å, formed by the thermal oxidation.

Next, as shown in FIG. 1F a blanket spacer layer 32, preferably, composed of polysilicon or silicon nitride ($Si_3N_4$) is deposited having a thickness of from about 1,500 Å to about 4,000 Å. In the case of polysilicon it is formed by the process of LPCVD (low pressure CVD) with a $SiH_4$ gas. In the case of silicon nitride ($Si_3N_4$), LPCVD with $SiH_2Cl_2$ and $NH_3$ gases is used. The advantage of using polysilicon or silicon nitride ($Si_3N_4$) is easier for end-point-detection (on oxide) so that plasma spacer etching will not damage the silicon. Alternatively, oxide (i.e. silicon dioxide) can be used instead of polysilicon or silicon nitride ($Si_3N_4$).

Figure 1G:
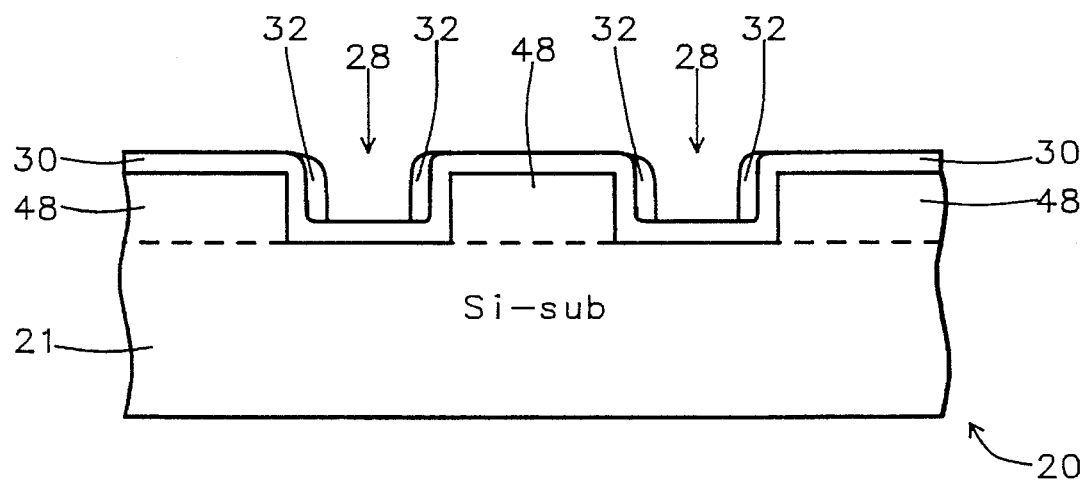

FIG. 1G shows the device of FIG. 1F after etching of spacer layer 32 of polysilicon or silicon nitride ($Si_3N_4$), preferably, with plasma etching, leaving spacers 32 adjacent to the walls of the trenches 28.

Figure 1H:
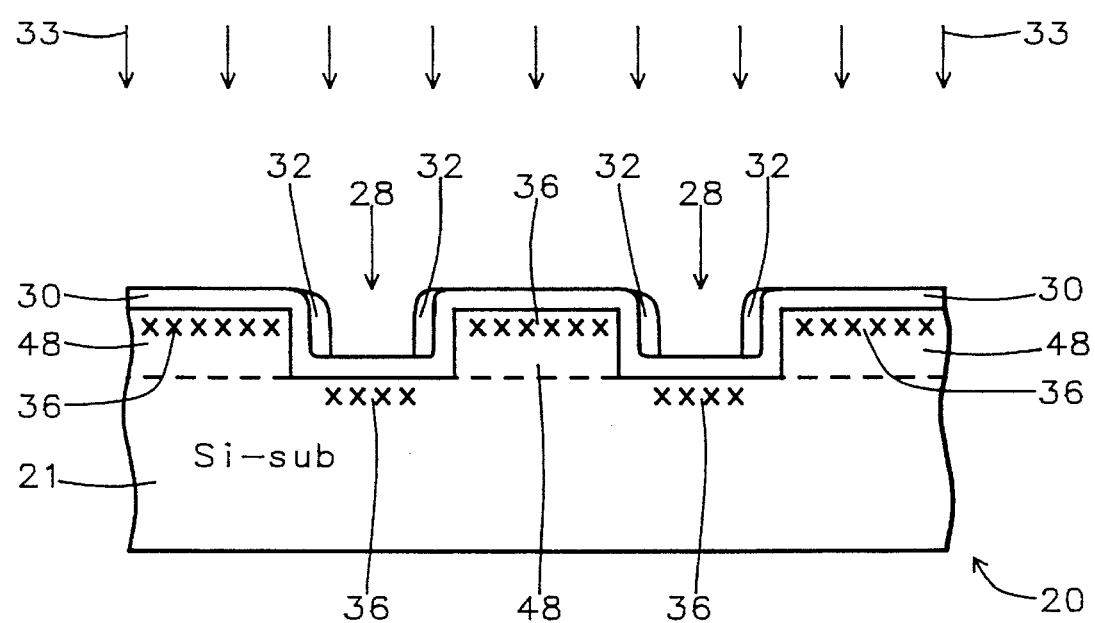

FIG. 1H shows the device of FIG. 1G after a self-aligned source/drain ion implantation with N type dopant ions 33 forming ion implanted regions 36. The silicon in regions 20 and 48 near the surface of the device are doped with a N type dopant by ion implantation with ions 33 composed of a dopant of arsenic, phosphorus, or antimony applied with a dose of about $1E15$ $cm^{-2}$ to about $6E15$ $cm^{-2}$. Such dopants are implanted at an energy of from about 30 KeV to about 80 KeV in a high current implanter type of tool. The preferred chemical species of the dopant implanted is arsenic, with a dose of from about $2E15$ $cm^{-2}$ to about $4E15$ $cm^{-2}$, at an energy of from about 40 KeV to about 60 KeV.

Figure 1I:
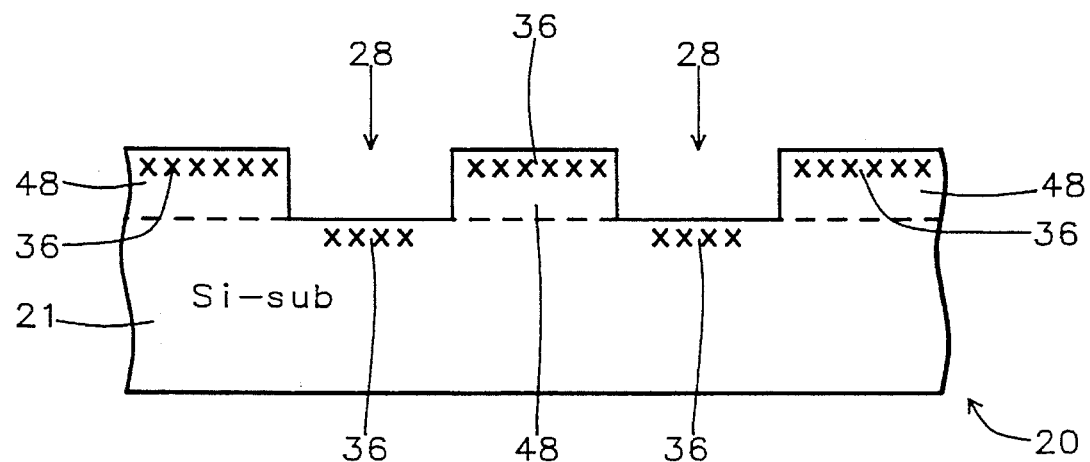

FIG. 1I shows the device of FIG. 1H after removal of the spacers 32 by etching of spacers 32 of polysilicon or silicon nitride ($Si_3N_4$). Preferably, the polysilicon is etched by plasma etching (gas of $CF_4$ or $SF_6$) or wet chemical etching (KOH.) In the case of silicon nitride ($Si_3N_4$) etching is performed by a plasma gas of $CF_4$ or $SF_6$ or wet chemical etching with $HPO_3$.

After etching away the spacers 32 the underlying silicon dioxide "oxide" layer 30 is etched away using a wet chemical etchant such as an aqueous solution of HF or BOE.

Figure 1J:
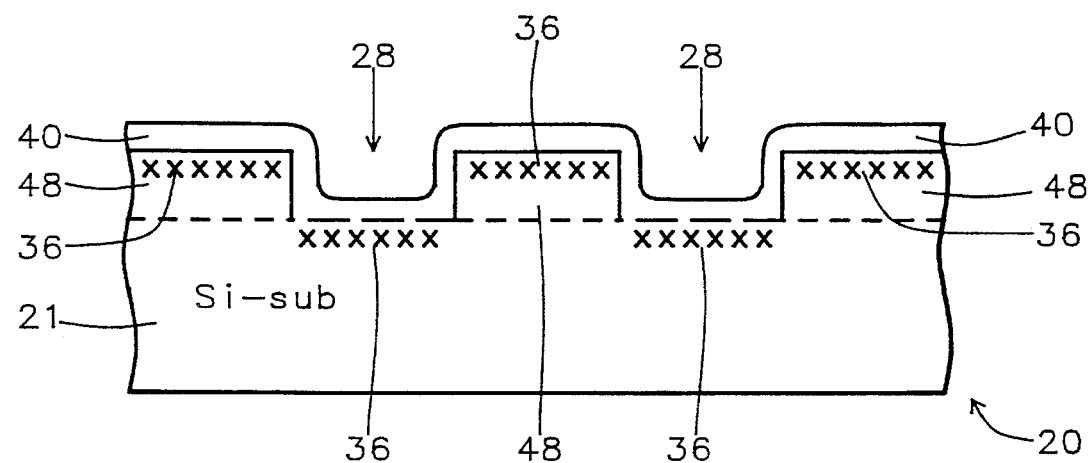

FIG. 1J shows the device of FIG. 1I after formation of a silicon dioxide gate "oxide" layer 40 having a thickness of from about 60 Å to about 200 Å, formed by the process of thermal oxidation or HTO (high temperature oxide by $SiH_2Cl_2+N_2O$) deposition.

Figure 1K:
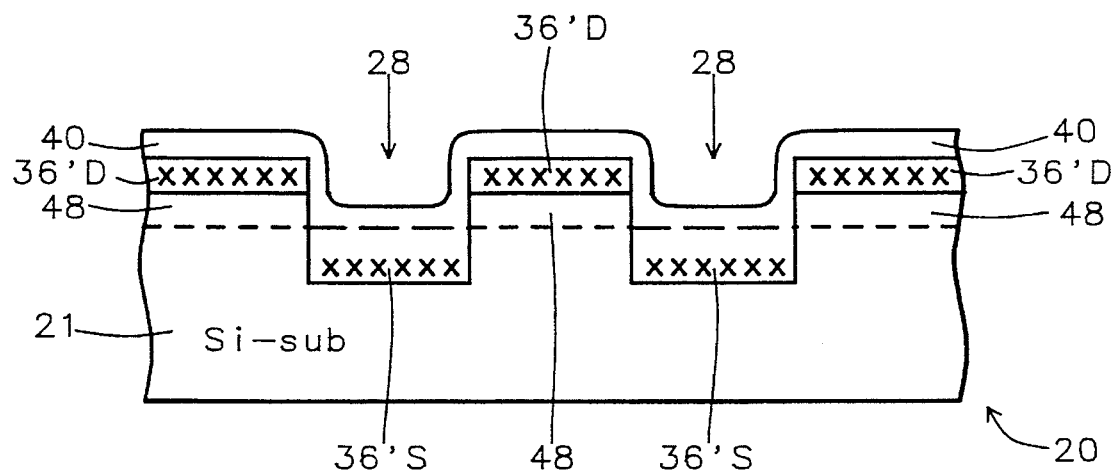

FIG. 1K shows the device of FIG. 1J after source/drain annealing at a temperature from about 850° C. to about 1,000° C. for a time from about 20 minutes to about 90 minutes. The result of the annealing is that ions 36 are driven deeper into regions 20 and 48 to form the source regions 36'S in the substrate 21 and drain 37'D regions in the regions 48.

Figure 1L:
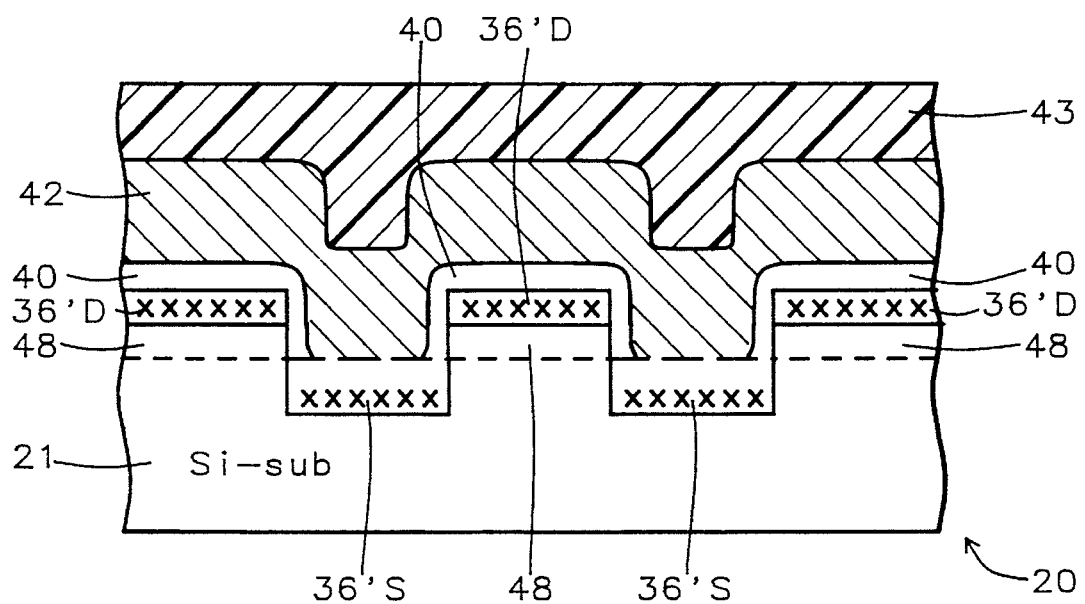

FIG. 1L shows the device of FIG. 1K after formation of a polycrystalline gate/word line layer 42 composed of polysilicon or polycide over silicon dioxide gate "oxide" layer 40. Polycrystalline gate/word line layer 42 is patterned by etching away portions thereof unprotected by gate photomask 43 to form gate and word lines from gate/word line layer 42.

Figure 2A:
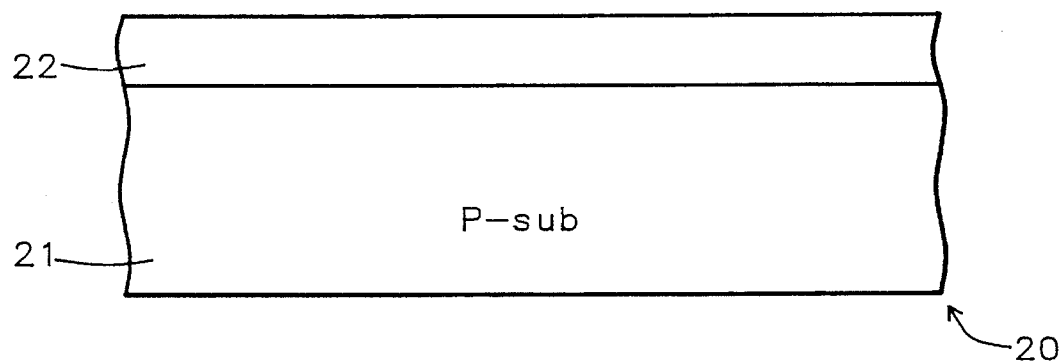
FIGS. 2A–2M show the process flow for formation of a ROM cell with silicide on the source and drain, as contrasted with the embodiment of FIGS. 1A–1L which show a ROM cell without silicide on the source or the drain.

An embodiment of this invention shown in FIGS. 2A–2N provides a ROM cell with silicide on the source and drain, as contrasted with the embodiment of FIGS. 1A–1L which show a ROM cell without silicide on the source or the drain.

FIG. 2A shows a device 20 in the early stages of manufacture comprising a silicon P- substrate (P-sub) 21 covered on the surface with a blanket, masking, silicon dioxide "oxide" layer 22 having a thickness of from about 500 Å to about 3,000 Å, formed by one of two processes:

1) Thermal oxidation, dry or wet, or

2) CVD oxide deposition of LTO (Low Temperature Oxide), basically $SiH_4+O_2$ or HTO (High Temperature Oxide), basically $SiH_4$ (or $SiH_2Cl_2$)+$N_2O$.

In this invention, we illustrate a process of N-ch Mask ROM Cell which should be started with a P-type silicon substrate. Alternatively one can have a P-ch Mask ROM Cell which should be started with a N-type silicon substrate, as will be obvious to those skilled in the art.

Figure 2B:
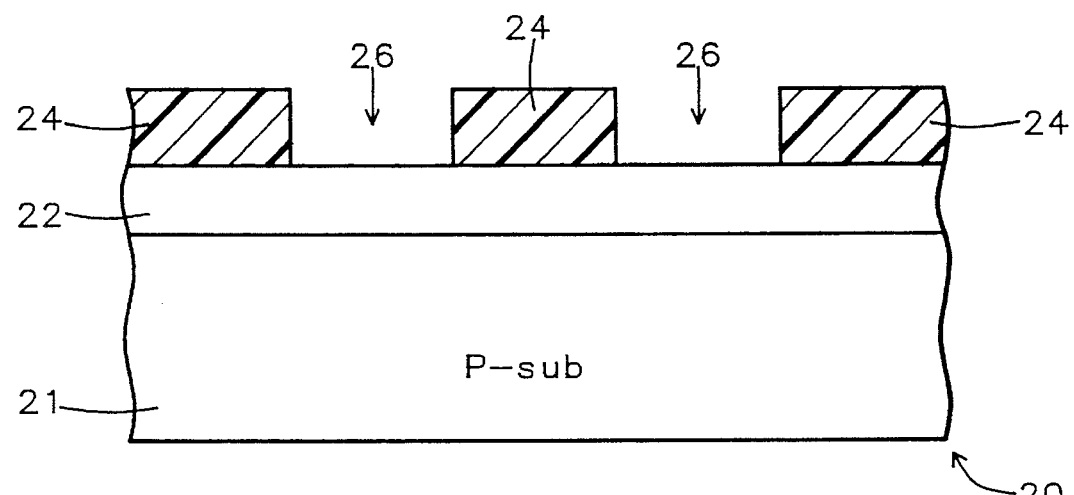

FIG. 2B shows the device of FIG. 2A with a mask 24 with openings 26 therein formed on masking "oxide" layer 26. The mask 24 which is composed of photoresist has been patterned photolithographically with a source/drain pattern by exposure and development in a conventional way. Then the patterned mask 24 is employed to etch away the unwanted portions of masking layer 22 leaving behind source/drain mask elements of masking layer 22 below mask 24. The etching of silicon dioxide masking "oxide" layer 22 is performed through openings 26 in mask 24 to form openings 27 in masking layer 22. Openings 27 in masking layer 22 are below openings 26 in mask 24. The etching of masking "oxide" layer 22 is performed using plasma etching using an etching gas such as $C_2F_6$, $CHF_3$, or $CF_4$ as well known etchants for oxide removal.

After etching, the mask elements 24 are stripped from the device 20 by means of a conventional process for removal of photoresist. The preferred stripping process is preferably $O_2$ plasma stripping followed by $H_2SO_4/H_2O_2$.

Figure 2C:
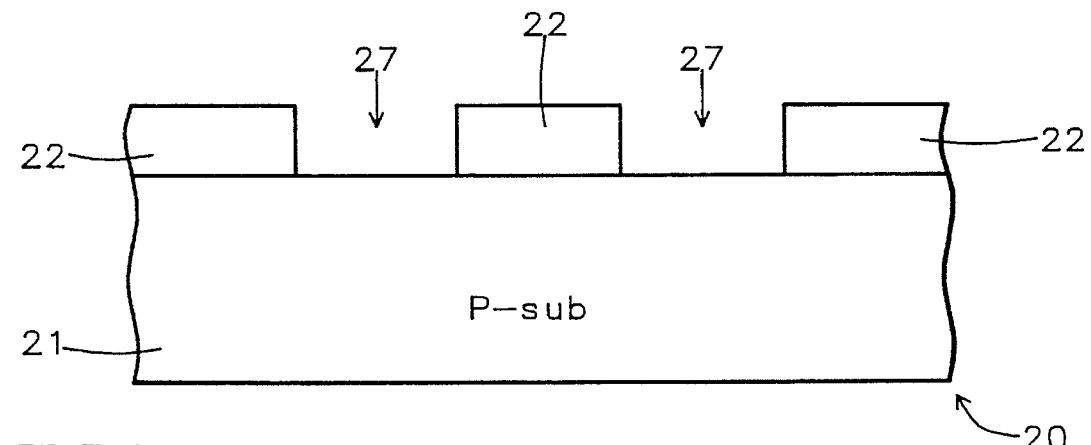

FIG. 2C shows the device of FIG. 2B with the new openings 27 in layer 22 and after stripping of the mask 24.

Figure 2D:
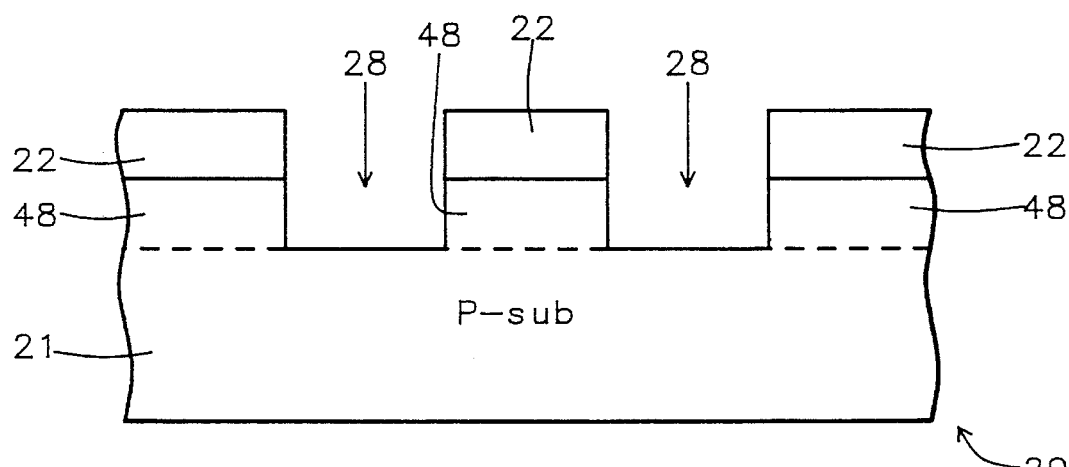

FIG. 2D shows the device of FIG. 2C after "trench" etching of silicon substrate 21 through openings 27 in layer 22 silicon dioxide masking "oxide" layer 22 to form trenches 28 in P-silicon substrate 21 to a depth of from about 3,000 Å to about 15,000 Å. The trenches 28 have vertical sidewalls and a horizontal base parallel to the surface of the substrate 21. The substrate 21 has upper surfaces (the original surfaces of the substrate) between and/or aside from said trenches 28. The etching of P- silicon substrate 21 is performed using plasma etching using gas such as $Cl_2$, HBr or other known etchants.

After the plasma silicon etching to form trenches 28, a process of wet chemical cleaning is performed using an aqueous solution of acids and alcohol such as $HF/HNO_3/CH_3COOH$ to remove possible contamination or damage introduced by the plasma etching process. Adjacent to the trenches 28 are regions 48 of the substrate 21 which will provide the vertical channels of ROM cells.

Figure 2E:
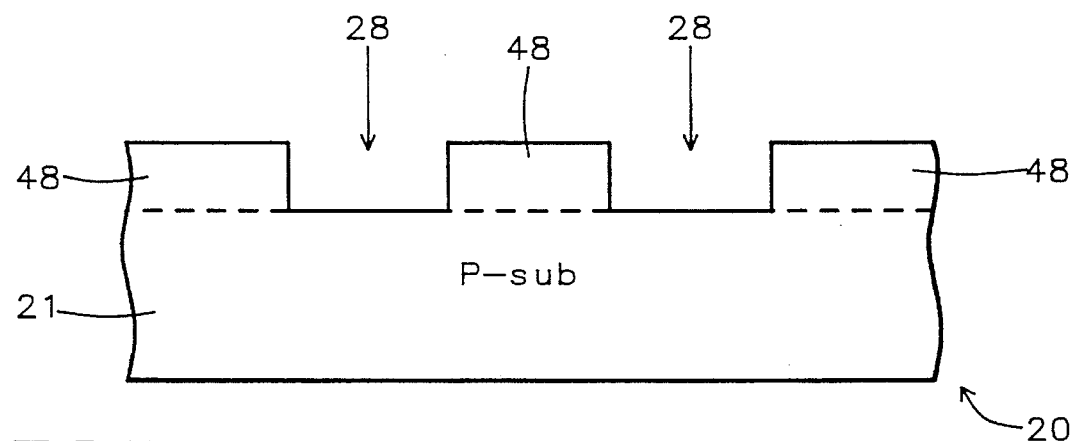

FIG. 2E shows the device of FIG. 2D after removal of the remainder of the masking, silicon dioxide "oxide" layer 22, leaving the trenches 28 between the regions 48. This second etching of masking "oxide" layer 22 is performed using using wet chemical etching such as HF or BOE (buffered oxide etchant.) In FIG. 1B and FIG. 1C on the other hand, plasma oxide etching was used because a vertical etched profile is needed there and is not necessary in connection with FIG. 2E.

Figure 2F:
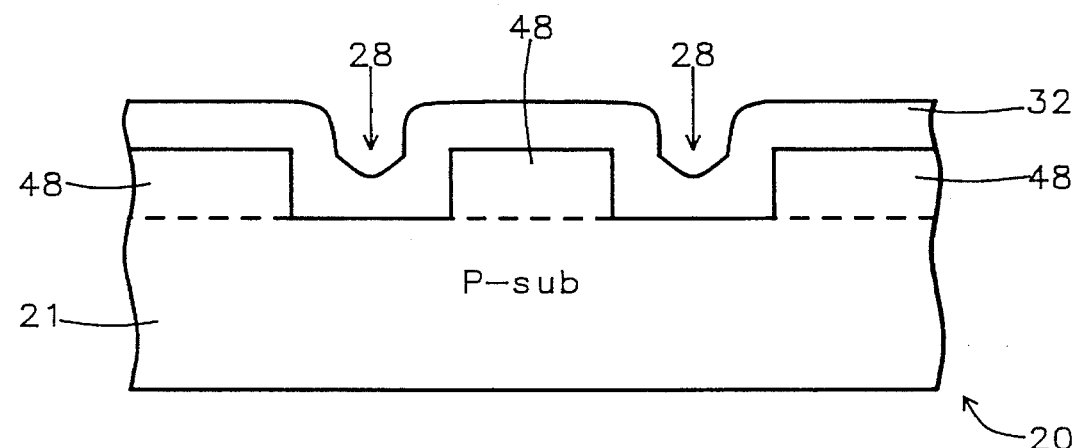

Next, as shown in FIG. 2F a spacer layer 32 composed of preferably of silicon nitride ($Si_3N_4$) is deposited having a thickness of from about 1,500 Å to about 4,000 Å. (Note that in the case of this embodiment of the invention, no sub-spacer layer 30 is employed.) The silicon nitride ($Si_3N_4$) spacer layer 32 is formed by the process of LPCVD (low pressure CVD) with a $SiH_4$ gas with $SiH_2Cl_2$ and $NH_3$ gases. The advantage of using silicon nitride ($Si_3N_4$) is that one can remove the silicon nitride ($Si_3N_4$) spacer layer 32 later (as described in connection with FIG. 2K) with phosphoric acid which will not attack cobalt silicide.

Figure 2G:
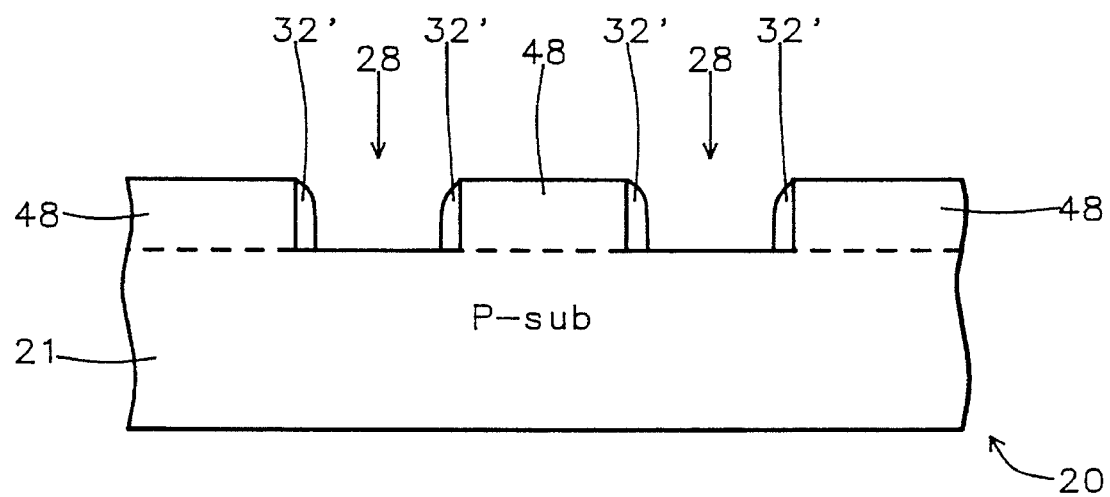

FIG. 2G shows the device of FIG. 2F after etching of spacer layer of silicon nitride ($Si_3N_4$), preferably, by plasma etching with a gas, i,e. $C_2F_6+CHF_3$ or $NF_3$, leaving spacers 32 adjacent to the walls of the trenches 28. After the spacer etching wet chemical treatment with a solution such as $HF/HNO_3/CH_3HOOH$ mixture should be applied to remove the possible damage introduced by the plasma processing.

Figure 2H:
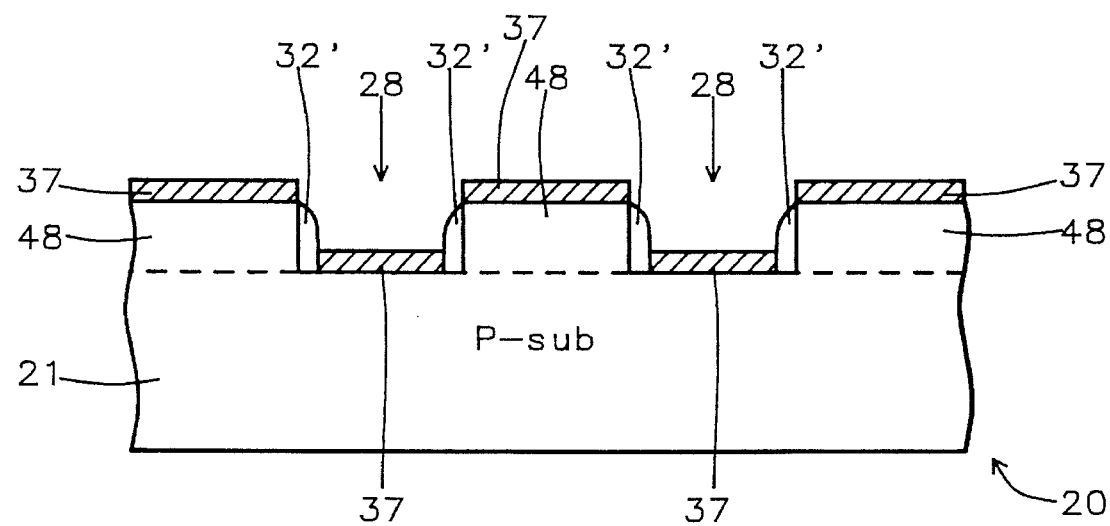

FIG. 2H shows the device of FIG. 2G after deposition of a layer 37 of a metal, preferably cobalt, adapted for forming a silicide selected from on top of silicon regions 21 and 48 having a thickness of from about 400 Å to about 1,000 Å, formed by the process of sputtering cobalt.

Silicides have the positive features of both layers with good stability, adherence, and a high conductivity. Suitable metal elements for layer 37 are selected from the group consisting of W, Ti, Co, Mo, and Ta providing corresponding silicides consisting of $WSi_2$, $TiSi_2$, $CoSi_2$, $MoSi_2$, and $TaSi_2$.

Figure 2I:
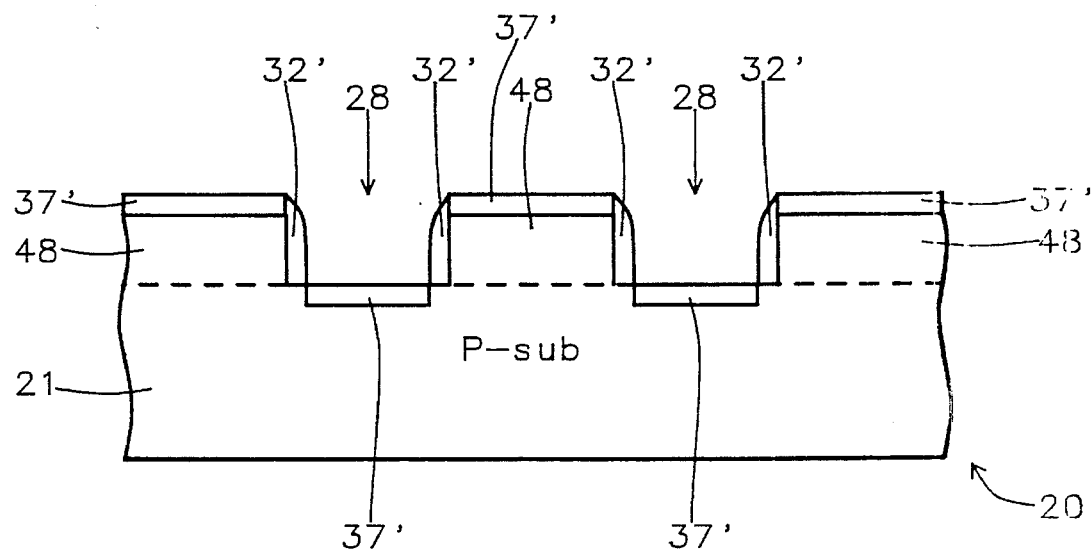

FIG. 2I shows the device of FIG. 2H after metal layer 37 has been treated by means of thermal annealing and then etching to form a silicide 37', preferably in the form of cobalt silicide $CoSi_2$. The etching of unreacted metal is usually a wet chemical etching with solution such as a mixture of $NH_4OH$, $H_2O_2$, and $H_2O$. The cobalt silicide is preferably formed by the process as follows:

1) Sputter cobalt,

2) Thermal annealing (furnace or rapid thermal anneal) to form CoSi temperature in the range of 650° C. and 750° C.

3) Etching of unreacted Co (on spacer surface) with $NH_4OH/H_2O_2/H_2O$ solution mixture.

4) Thermal annealing (furnace or rapid thermal anneal) to form $CoSi_2$ temperature in the range of 850° C. and 950° C.

Figure 2J:
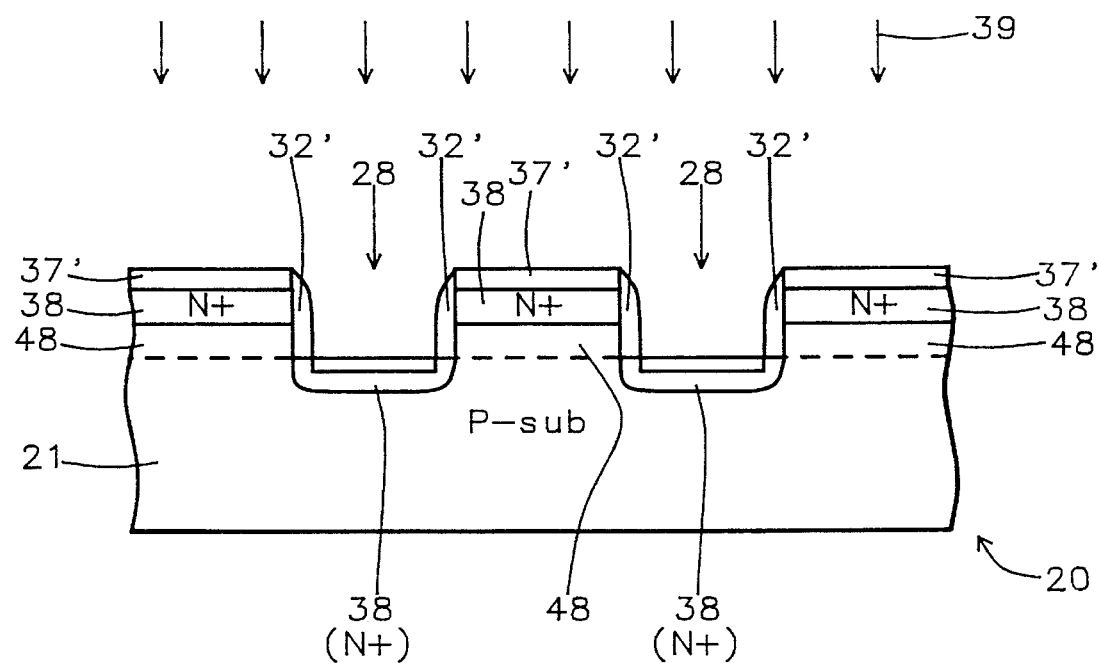

FIG. 2J shows the device of FIG. 2I after formation of source/drain doped regions 38 by self-aligned source/drain ion implantation with N+ ions 39. The silicon in regions 21 and 48 near the surface of the device are doped with an N dopant by ion implantation with ions 33 composed of a dopant of arsenic, phosphorus, or antimony applied with a dose of about $8E14$ $cm^{-2}$ to about $4E15$ $cm^{-2}$. Such dopants are implanted at an energy of from about 30 KeV to about 60 KeV in a high current implanter type of tool. The preferred chemical species of the dopant implanted is arsenic (As) with a dose of from about $1E15$ $cm^{-2}$ to about $3E15$ $cm^{-2}$, at an energy of from about 30 KeV to about 60 KeV.

Figure 2K:
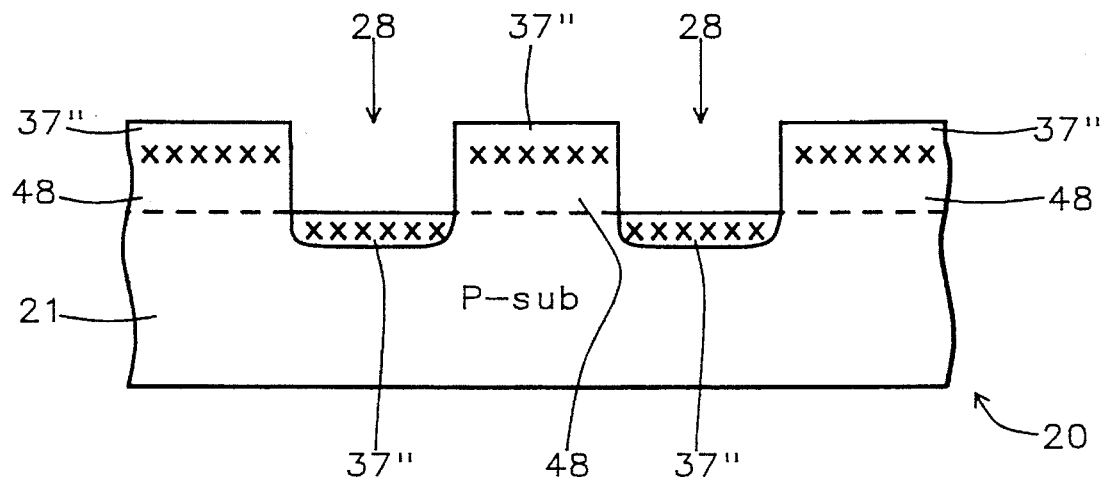

FIG. 2K shows the device of FIG. 2J after forming ion implanted regions 37" from the combination of regions 37' and N+ doped regions 38 annealing at a temperature from about 750° C. to about 900° C. for a time of at least about 20 minutes. The annealing activates the source/drain dopants (forming source S and drain D regions 37") and implantation damage. Next, the spacers 32' and are removed by etching of spacers 32' preferably, with phosphoric acid $HPO_3$ which does not etch (attack) cobalt silicide.

Figure 2L:
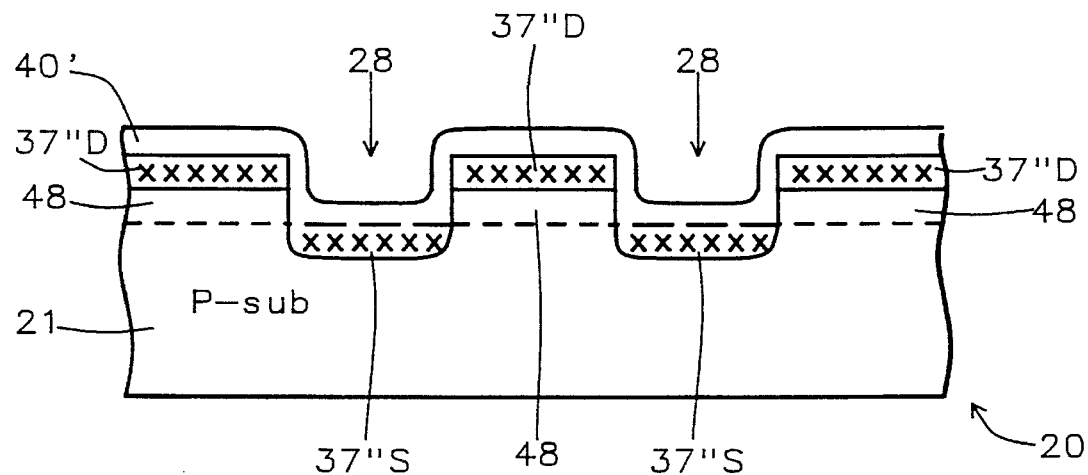

FIG. 2L shows the device of FIG. 2K after formation of a silicon dioxide gate "oxide" layer 40' having a thickness of from about 60 Å to about 200 Å, formed by the process of thermal oxidation or HTO (High Temperature Oxide) deposition with $SiH_4/N_2O$ or $SiH_2Cl_2/N_2O$ gases.

Figure 2M:
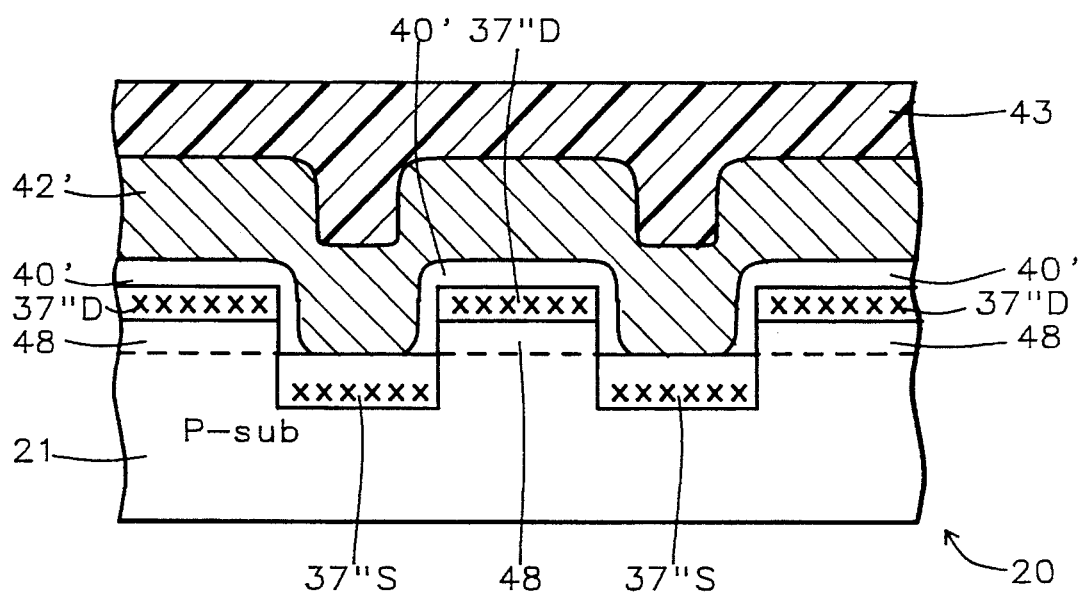

FIG. 2M shows the device of FIG. 2M after formation of a polycrystalline gate/word line layer 42' composed of polysilicon or polycide over silicon dioxide gate "oxide" layer 40'. Portions of polycrystalline gate/word line layer 42 unprotected by gate photomask 43 are etched away to form gate and word lines from gate/word line layer 42.

Figure 3:
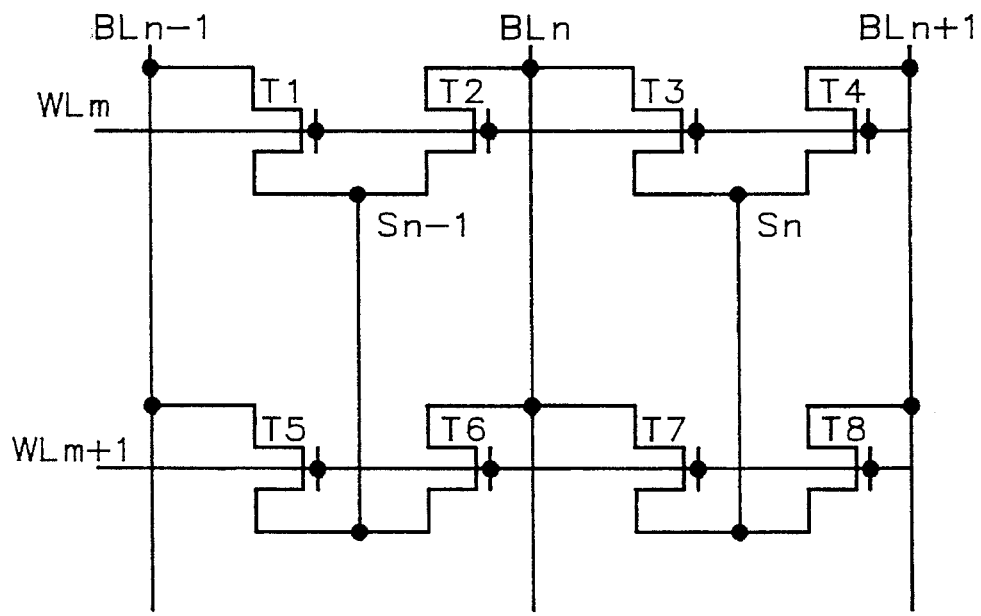
FIG. 3 shows an electrical schematic diagram of a ROM array manufacture in accordance with this invention.

FIG. 3 shows an electrical schematic diagram of a ROM array manufacture in accordance with this invention. FIG. 3 shows eight FET transistors. Four of those FET transistors T1, T2, T3, T4, have their gates connected to word line WLm. The other four FET transistors T5, T6, T7, and T8 have their gates connected to word line WLm+i. The transistors T1 and T5 have their drains connected to bit line BLn−1; transistors T2, T3, T6 and T7 have their drains connected to bit line BLn; and transistors T4 and T8 have their drains connected to bit line BLn+1. Transistors T1, T2, T5, and T6 have their sources connected together in a common node Sn−1; and transistors T3, T4, T7, and T8 have their sources connected together in a common node Sn.

Figure 4:
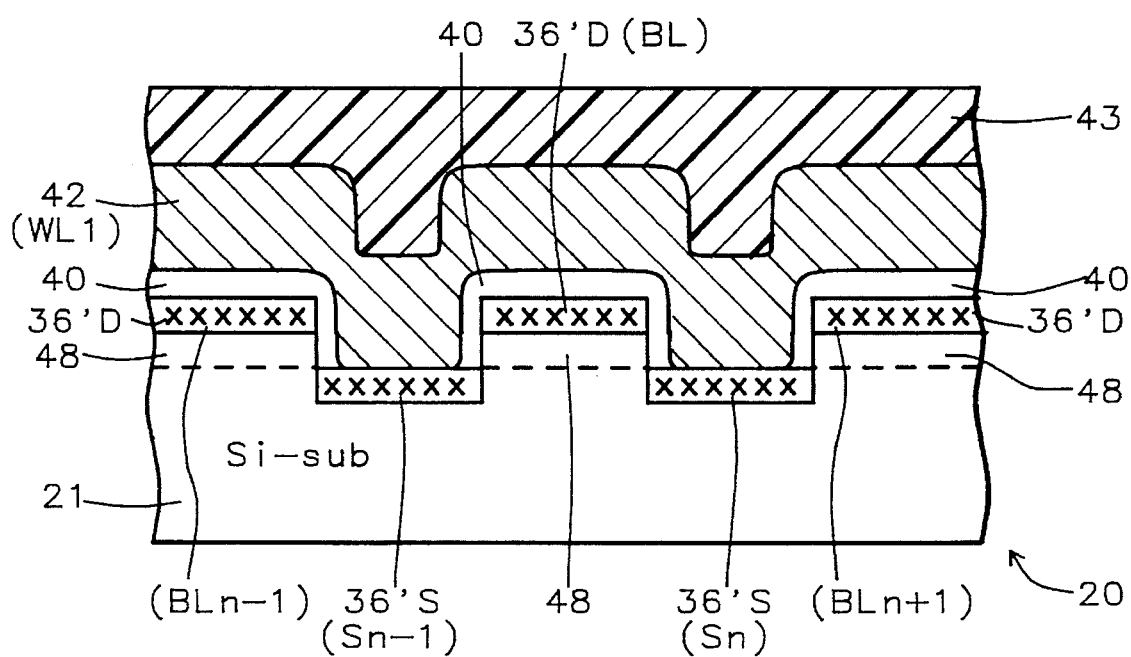
FIG. 4 shows a sectional view similar to FIG. 1L of a portion of the circuit of FIG. 3 with the bit lines and source lines indicated as BLn−1, BL, and BLn+1 and the source connections Sn−1 and Sn.

FIG. 4 shows a sectional view similar to FIG. 1L of a portion of the circuit of FIG. 3 with the bit lines and source lines indicated as BLn−1, BL, and BLn+1 and the source connections Sn−1 and Sn.

Figure 5:
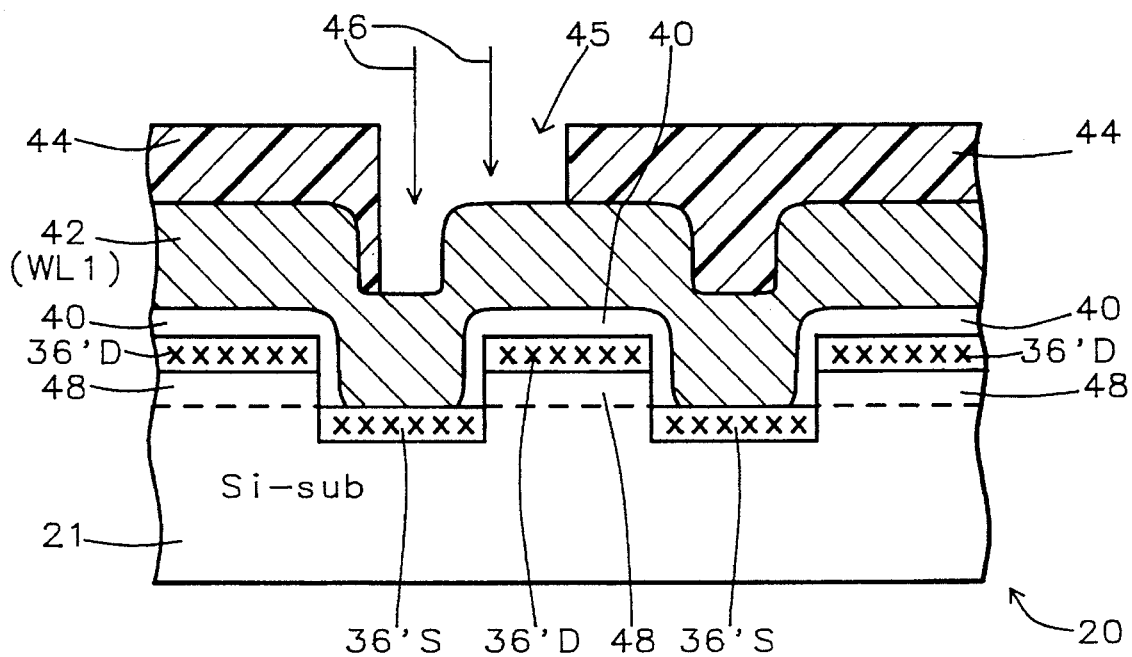
FIG. 5 shows a sectional view similar to FIG. 4 with a ROM code mask over the device of FIG. 4 for the purpose of making a ROM code implant ions into opening in a mask.

FIG. 5 shows a sectional view similar to FIG. 4 with a ROM code mask 44 over the device of FIG. 4 for the purpose of making a ROM code implant ions 46 into opening 45 in mask 44. The ions 46 are implanted in the channel below opening 45 between the source 36'S on the left and the drain 36'D in the center of the device. This step is performed after the polysilicon or polycide patterning. This is done before the deposition of the BPSG dielectric layer. The ions 46 are implanted into region 48 below the middle drain 36'D which is where the channel is located near the surface of the device are doped with a P type dopant by ion implantation with ions 46 composed of a dopant of boron applied with a dose of about $1E13$ $cm^{-2}$ to about $510E14$ $cm^{-2}$. Such dopants are implanted at an energy of from about 100 KeV to about 300 KeV in a high current implanter type of tool. The preferred chemical species of the dopant implanted is boron with a dose of from about $8E13$ $cm^{-2}$ to about $4E14$ $cm^{-2}$, at an energy of greater than or equal to 180 KeV to about 300 KeV.

Contact Formation

A requirement for this type of device is contact formation for forming metallization down to the bottom-source N+ at a predetermined position in the device. The contact formation involves use of photomasking, and implanting a dopant of phosphorous or the equivalent and driving the dopant to a depth required to contact the N+ region at the bottom of the trench.

Figure 6:
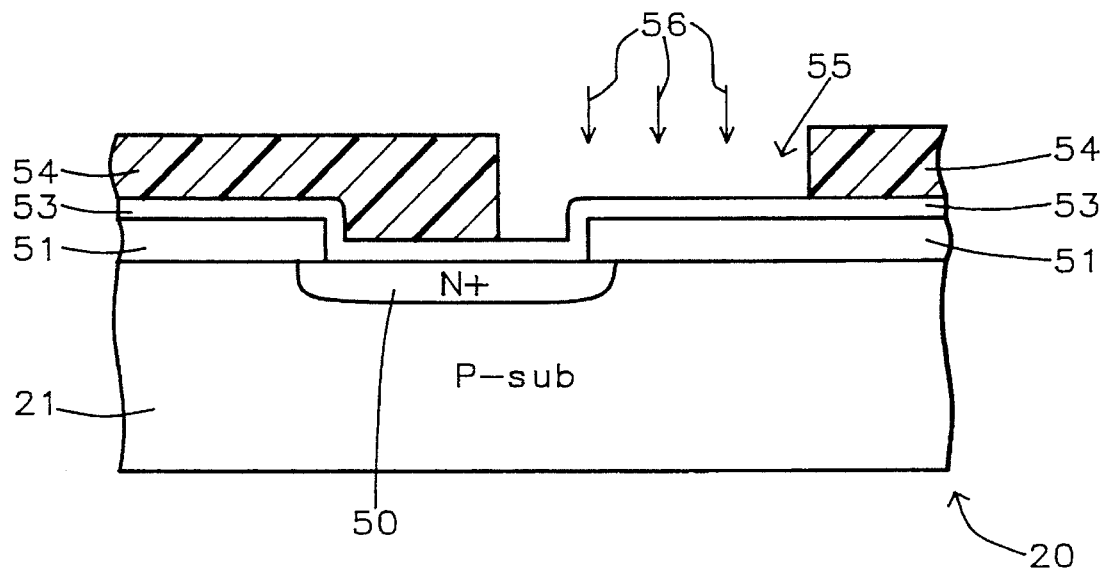
FIG. 6 shows a semiconductor device in accordance with this invention in an intermediate stage of manufacture. A silicon P− substrate (P-sub) includes an N+ region on the surface of the P− substrate.

FIG. 6 shows a semiconductor device 20 in accordance with this invention in an intermediate stage of manufacture comprising a silicon P- substrate (P-sub) 21. On the surface of the P- substrate 21 is an N+ region 50. Layer 51 is the silicon which is not trench etched like layer 48 in FIG. 2D. Next, above layer 51 is a gate oxide layer 53, which is the remaining gate oxide, remaining after polysilicon or polycide gate etching.

Above the gate oxide layer 53 is a photoresist mask 54 with an opening 55 into which dopant 56 is being ion implanted. Dopant 56 comprises phosphorous, arsenic, or antimony applied with a dose of about 1E15 cm$^{-2}$ to about 6E15 cm$^{-2}$. Such dopants are implanted at an energy of from about 100 KeV to about 300 KeV in a high current implanter type of tool. The preferred chemical species of the dopant implanted is phosphorous (P) with a dose of from about 1E15 cm$^{-2}$ to about 6E15 cm$^{-2}$, at an energy of greater than or equal to 120 KeV to about 300 KeV.

Figure 7:
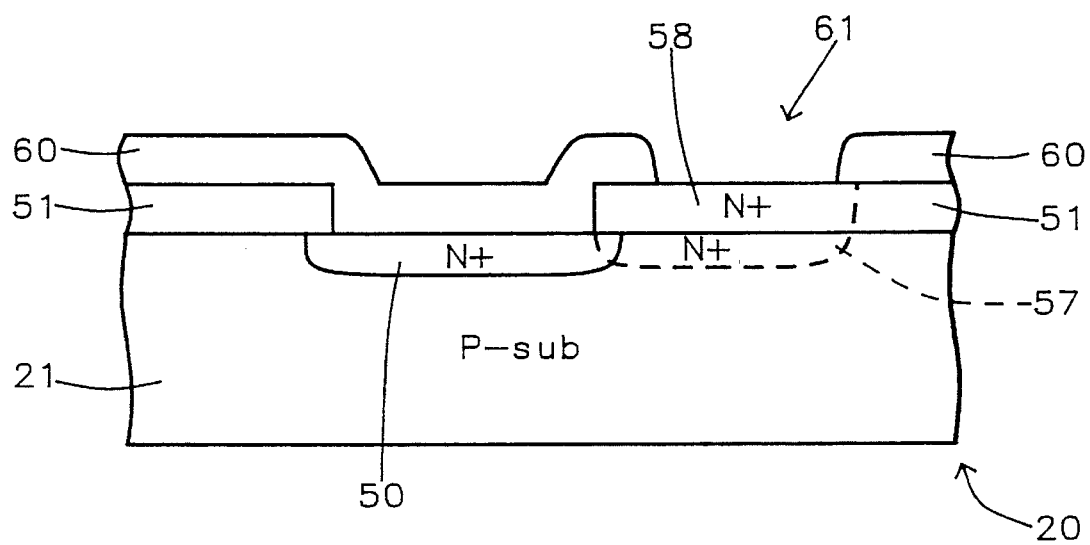
FIG. 7 shows a subsequent stage of manufacture of the device of FIG. 6 with an N+ region into which phosphorus or arsenic have been implanted.

FIG. 7 shows a subsequent stage of manufacture of the device of FIG. 6 with an N+ region 58 into which phosphorus or arsenic have been implanted. Below where the opening in mask 54 permits the implant in FIG. 6. An interlayer dielectric (ILD) layer 60 has been formed over the device after removal of the mask 54. The ILD layer is preferably composed of BPSG, having a thickness of from about 4,000 Å to about 13,000 Å patterned with a contact opening 61 to another N+ region. The region 57 in substrate 21 below N+ region 58 comprises the buried source of the ROM.

Figure 8:
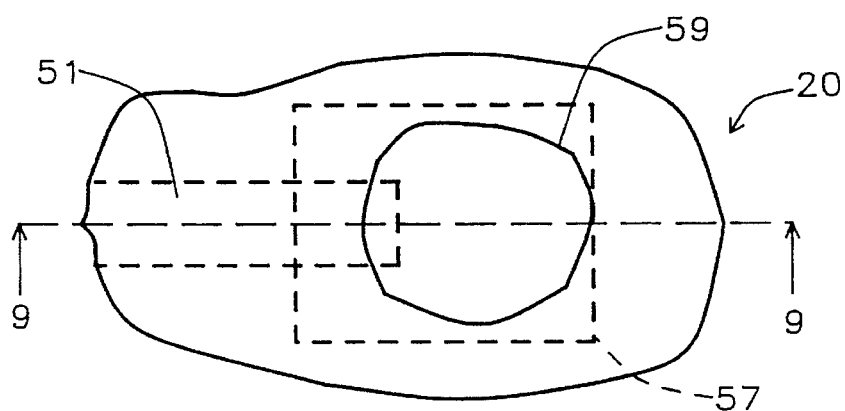
FIG. 8 shows a plan view of a fragment of the device of FIG. 7 illustrating a metal contact in an ILD layer opening.
Figure 9:
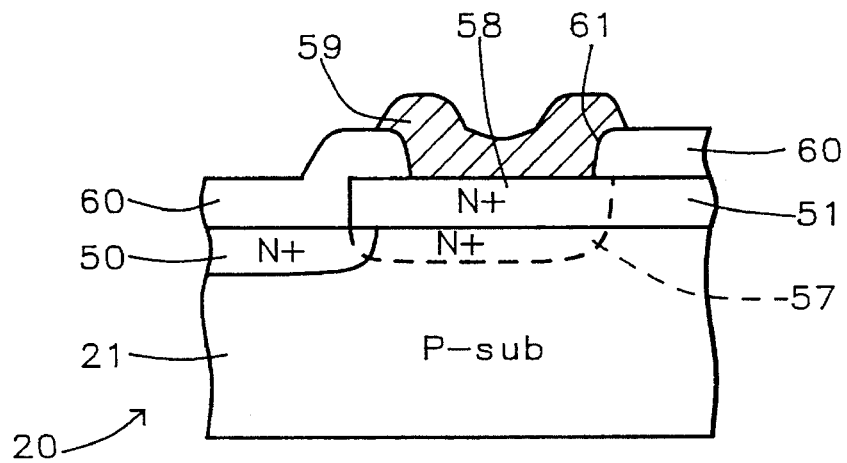
FIG. 9 is a sectional view taken along line 9—9 of FIG. 8 showing how the metal contact is in contact with N+ region over an N+ buried source region.

FIG. 8 shows a plan view of a fragment of the device of FIG. 7 illustrating the metal contact 59 in opening 61 in ILD layer 60. FIG. 9 is a sectional view taken along line 9—9 of FIG. 8 showing how the metal contact is in contact with N+ region 58 over N+ buried source region 57. Region 50 is the trenched N+ source.

Referring to FIGS. 6–9, to read a cell, e.g. bit-line, word-line, source (n, m, n–1) a cell is selected as illustrated in Table I as follows:

TABLE I

|  | Bitline | Source | Wordline |
| --- | --- | --- | --- |
| Selected | 2.0 V | Ground | Vcc |
| Unselected sharing same bit-line and word-line | 2.0 V | Float | Vcc |
| Unselected others | Float or Ground | Float or Ground | Ground |

SUMMARY

There are several advantages of this invention.
1) Source/Drain (bottom/top) are formed at the same time.
2) Silicided Source/Drain reduces source/drain resistance.
3) Flat structure, i.e. no field oxide in the ROM array for ROM. 4) One trench for two transistors, i.e. ROM cell size is reduced to half that of a conventional flat cell using the same layout rule.

While this invention has been described in terms of the above embodiments, one skilled in the art can recognize that the invention can be practiced with modifications within the spirit and scope of the appended claims, i.e. changes can be made in form and detail, without departing from the spirit and scope of the invention. Such changes come within the purview of the present invention and the invention encompasses the subject matter of the claims which follow.

Having thus described the invention, what is claimed as new and desirable to be secured by Letters Patent is as follows:

1. A method of manufacture of a semiconductor memory device including a silicon semiconductor substrate with a vertical channel comprising the sequence of steps as follows:

forming a first dielectric masking layer patterned with pattern of trench openings therethrough on said substrate, etching of trenches in the surface of the semiconductor substrate through said first dielectric masking layer, said trenches having bases and sidewalls, said substrate having upper surfaces between and/or aside from said trenches, removing said masking layer, forming a sub-spacer layer on the surface of said device, forming a spacer layer over said sub-spacer dielectric layer, shaping said spacer layer to form spacers over said sub-spacer dielectric layer in said trenches along said sidewalls, ion implanting source/drain ions to deposit dopant in said substrate, removing said spacer layer and said sub-spacer layer from said device, forming a silicon dioxide layer over said device, source/drain annealing said device to form source/drain regions in said silicon semiconductor substrate, and forming and patterning a conductive word-line over said dielectric layer.

2. The method of claim 1 wherein said trenches are formed by forming said first dielectric layer for masking comprising a silicon dioxide layer on said silicon substrate, and forming a photoresist mask on said masking silicon dioxide layer, etching said masking silicon dioxide layer through said photoresist mask to form a trench mask in said masking silicon dioxide layer, and etching of said silicon through said trench mask formed by said masking silicon dioxide layer to form said trench.

3. The method of claim 2 wherein said spacers are formed by the steps comprising removing said masking silicon dioxide layer, forming said sub-spacer of a dielectric layer comprising silicon dioxide over said device including said trenches, forming said spacer layer composed of a material selected from the group consisting of polysilicon and silicon nitride over said sub-spacer dielectric layer, and then etching said spacer layer to form said spacers.

4. The method of claim 3 wherein subsequent to formation of said spacers the step fellows comprising, performing said source/drain ion implantation as a self-aligned ion implantation with ions composed of a dopant selected from the group comprising arsenic, phosphorus, and antimony applied with a dose of from about 1E15 cm$^{-2}$ to about 6E15 cm$^{-2}$ implanted at an energy of from about 30 KeV to about 80 KeV.

5. The method of claim 1 wherein subsequent to removing said spacer layer the step follows comprising, said silicon dioxide layer comprises a gate oxide layer having a thickness between about 60 Å and about 200 Å said gate oxide layer being formed ever said device including said trenches.

6. The method of claim 5 wherein subsequent to forming said gate oxide layer over said device including said trenches the step follows comprising, said source/drain annealing of said device to drive in said deposit of ion implanted dopant into said substrate to form source regions and drain regions therein is performed at a temperature from about 850° C. to about 1,000° C. for a time from about 20 minutes to about 90 minutes.

7. The method of claim 5 wherein source regions extend across beneath said trenches and said drain regions are juxtaposed with said trenches above the ends of said source regions.

8. The method of claim 1 wherein subsequent to forming and patterning said conductive word-line the steps are performed comprising forming a code implant mask over said word-line layer, and ion implanting through said code implant mask into said device.

9. A method of manufacture of a semiconductor memory device including a silicon semiconductor substrate with a vertical channel comprising the sequence of steps as follows:

forming a first dielectric masking layer patterned with pattern of trench openings therethrough on said substrate, etching of trenches in the surface of the semiconductor substrate through said first dielectric masking layer, said trenches having bases and sidewalls, said substrate having upper surfaces between and/or aside from said trenches, removing said masking layer, forming a spacer layer on the surface of said device, shaping said spacer layer to form spacers ever said silicon substrate in said trenches along said sidewalls, depositing a layer of a metal selected from the group consisting of W, Ti, Co, Me, and Ta ever said substrate including said trenches, annealing said device to form silicides between said layer of metal and said silicon substrate, etching away unreacted metal, ion implanting source/drain dopant into said substrate, annealing said device to activate said source/drain dopant to form source/drain regions in said silicon semiconductor substrate, removing said spacers from said device, formation of a gate oxide layer over said device, and forming and patterning a conductive word-line ever said dielectric layer.

10. The method of claim 9 wherein said spacers are formed by the steps comprising removing said masking silicon dioxide layer exposing said substrate including said trenches, forming said spacer layer comprising silicon nitride over said said substrate including said trenches, and etching said spacer layer to form said spacers.

11. The method of claim 9 wherein said spacers are formed by the steps of:
a) first removing said masking silicon dioxide layer exposing said substrate including said trenches, and
b) second etching said spacer layer to form said spacers, then subsequent to formation of said spacers the step follows comprising, deposition of a metal on the surface of said device on top of said silicon substrate.

12. The method of claim 11 wherein said metal comprises cobalt.

13. The method of claim 11 wherein subsequent to deposition of said metal on the surface of said device the step follows comprising, formation of a silicide from said doped surfaces of said substrate including the surfaces of said trenches with the exception of the surfaces protected by said spacers.

14. The method of claim 13 wherein subsequent to formation of said silicide the step follows comprising, performing said source/drain self-aligned ion implantation.

15. The method of claim 14 wherein subsequent to said source/drain self-aligned ion implantation the step follows comprising, removing said spacers, whereby said substrate including said trenches is exposed, and annealing said device to drive in said deposit of ion implanted dopant into said substrate to form source regions and drain regions therein is performed at a temperature from about 750° C. to about 900° C. for a time of at least 20 minutes.

16. The method of claim 15 wherein subsequent to removing said spacers and annealing, the step follows comprising, forming a gate oxide layer having a thickness between about 60 Å and about 200 Å, said gate oxide layer being formed over said device including said trenches.

17. The method of claim 16 wherein subsequent to forming a gate oxide layer over said device including said trenches the step follows comprises formation of a gate word line layer over said gate oxide layer.

18. The method of claim 15 wherein source regions extend across beneath said trenches and said drain regions are juxtaposed with said trenches above the ends of said source regions.

19. The method of claim 9 wherein subsequent to forming and patterning said conductive word-line the steps are performed comprising forming a code implant mask over said word-line layer, and ion implanting through said code implant mask into said device.

20. The method of claim 9 including removing said masking silicon dioxide layer to expose said substrate including said trenches by wet chemical etching using an etchant selected from the group consisting of hydrogen fluoride and buffered oxide etchant, forming said spacers by the steps of:
a) depositing said spacer layer comprising silicon nitride having a thickness between about 1,500 Å and about 4000 Å deposited by LPCVD over said substrate including said trenches,
b) second etching said spacer layer to form said spacers, then subsequent to formation of said spacers a subsequent step follows comprising, deposition of cobalt metal on the surface of said device on top of said silicon substrate, subsequent to deposition of said cobalt metal on the surface of said device the step follows comprising, formation of cobalt silicide from said doped surfaces of said substrate including the surfaces of said trenches with the exception of the surfaces protected by said spacers, subsequent to formation of said silicide the step follows comprising, performing said source/drain self-aligned ion implantation, subsequent to said source/drain self-aligned ion implantation the step follows comprising, removing said spacers, whereby said substrate including said trenches is exposed, and annealing said device to drive in said deposit of ion implanted dopant into said substrate to form source regions and drain regions therein is performed at a temperature from about 750° C. to about 900° C. for a time of at least 20 minutes, subsequent to removing said spacers and annealing, the step follows comprising, forming a gate oxide layer having a thickness between about 60 Å and about 200 Å by a method selected from the group consisting of thermal oxidation and high temperature oxide deposition, said gate oxide layer being formed over said device including said trenches, subsequent to forming a gate oxide layer over said device including said trenches the step follows comprises formation of a gate word line layer over said gate oxide layer, and said source regions extend across beneath said trenches and said drain regions are juxtaposed with said trenches above the ends of said source regions, wherein subsequent to forming and patterning said conductive word-line the steps are performed comprising forming a code implant mask over said word-line layer, and ion implanting through said code implant mask into said device.

21. A method of manufacture of a semiconductor memory device on a silicon semiconductor substrate with a vertical channel comprising the sequence of steps as follows:

forming a silicon dioxide masking layer patterned with pattern of trench openings therethrough on said substrate, etching of trenches in the surface of the semiconductor substrate through said silicon dioxide masking layer, said trenches having bases and sidewalls, said substrate having upper surfaces between and/or aside from said trenches, removing said masking layer, forming a sub-spacer dielectric layer composed of silicon dioxide on the surface of said device, forming a spacer layer composed of a material selected from the group consisting of polysilicon and silicon nitride over said sub-spacer dielectric layer, shaping said spacer layer to form spacers in said trenches along said sidewalls, ion implanting source/drain ions to deposit dopant in said substrate, removing said spacers and said sub-spacer layer from said device, forming a gate oxide layer over said device, annealing said device to form source/drain regions in said silicon semiconductor substrate, and forming and patterning a conductive word-line over said dielectric layer.

22. The method of claim 21 wherein said trenches are formed by forming said first dielectric layer for masking comprising a silicon dioxide layer on said silicon substrate, and forming a photoresist mask on said masking silicon dioxide layer, etching said masking silicon dioxide layer through said photoresist mask to form a trench mask in said masking silicon dioxide layer, and etching of said silicon through said trench mask formed by said masking silicon dioxide layer to form said trench.

23. The method of claim 22 wherein said spacers are formed by the steps comprising removing said masking silicon dioxide layer, forming said sub-spacer dielectric layer of silicon dioxide having a thickness between about 200 Å and about 1,000 Å over said device including said trenches, forming said spacer layer having a thickness between about 1,500 Å and about 4,000 Å over said sub-spacer dielectric layer, and then etching said spacer layer by plasma etching to form said spacers.

24. The method of claims 21 wherein subsequent to removing said spacer layer and said sub-spacer layer the step follows comprising, forming a gate oxide layer over said device including said trenches.

25. The method of claim 24 wherein subsequent to forming a gate oxide layer over said device including said trenches the step follows comprising, source/drain annealing said device to drive in said deposit of ion implanted dopant into said substrate to form source regions and drain regions therein.

26. The method of claim 24 wherein source regions extend across beneath said trenches and said drain regions are juxtaposed with said trenches above the ends of said source regions.

27. The method of claim 21 wherein said trenches are formed by forming said first dielectric layer for masking comprising a silicon dioxide layer on said silicon substrate, and forming a photoresist mask on said masking silicon dioxide layer, etching said masking silicon dioxide layer through said photoresist mask to form a trench mask in said masking silicon dioxide layer, and etching of said silicon through said trench mask formed by said masking silicon dioxide layer to form said trench, removing said masking silicon dioxide layer, forming said sub-spacer dielectric layer of silicon dioxide having a thickness between about 200 Å and about 1,000 Å over said device including said trenches, forming said spacer layer having a thickness between about 1,500 Å and about 4,000 Å over said sub-spacer dielectric layer, and then etching said spacer layer by plasma etching to form said spacers, subsequent ion implanting source/drain ions to deposit dopant in said substrate and subsequent to removing said spacer layer and said sub-spacer layer the step follows of forming a gate oxide layer over said device including said trenches, subsequent to forming said gate oxide layer over said device including said trenches the step follows comprising source/drain annealing said device to drive in said deposit of ion implanted dopant into said substrate to form therein source regions and drain regions in said substrate.

28. The method of claim 21 wherein subsequent to removing said spacer layer and said sub-spacer layer the step follows comprising, said silicon dioxide layer comprises a gate oxide layer having a thickness between about 60 Å and about 200 Å, said gate oxide layer being formed over said device including said trenches.

29. The method of claim 21 wherein subsequent to forming said gate oxide layer over said device including said trenches the step follows comprising, said source/drain annealing of said device to drive in said deposit of ion implanted dopant into said substrate to form source regions and drain regions therein is performed at a temperature from about 850° C. to about 1,000° C. for a time from about 20 minutes to about 90 minutes.

30. The method of claim 21 wherein subsequent to forming and patterning said conductive word-line the steps are performed comprising forming a code implant mask over said word-line layer, and ion implanting through said code implant mask into said device.

31. The method of claim 21 including removing said masking silicon dioxide layer to expose said substrate including said trenches by wet chemical etching using an etchant selected from the group consisting of hydrogen fluoride and buffered oxide etchant, forming said spacers by the steps of:
a) depositing said spacer layer comprising silicon nitride having a thickness between about 1,500 Å and about 4000 Å deposited by LPCVD over said substrate including said trenches,
b) second etching said spacer layer to form said spacers, then subsequent to formation of said spacers a subsequent step follows comprising, deposition of cobalt metal on the surface of said device on top of said silicon substrate, subsequent to deposition of said cobalt metal on the surface of said device the step follows comprising, formation of cobalt silicide from said doped surfaces of said substrate including the surfaces of said trenches with the exception of the surfaces protected by said spacers, subsequent to formation of said silicide the step follows comprising, performing said source/drain self-aligned ion implantation, subsequent to said source/drain self-aligned ion implantation the step follows comprising, removing said spacers, whereby said substrate including said trenches is exposed, and annealing said device to drive in said deposit of ion implanted dopant into said substrate to form source regions and drain regions therein is performed at a temperature from about 750° C. to about 900° C. for a time of at least 20 minutes, subsequent to removing said spacers and annealing, the step follows comprising, forming a gate oxide layer having a thickness between about 60 Å and about 200 Å by a method selected from the group consisting of thermal oxidation and high temperature oxide deposition, said gate oxide layer being formed over said device including said trenches, subsequent to forming a gate oxide layer over said device including said trenches the step follows comprises formation of a gate word line layer over said gate oxide layer, and said source regions extend across beneath said trenches and said drain regions are juxtaposed with said trenches above the ends of said source regions, wherein subsequent to forming and patterning said conductive word-line the steps are performed comprising, forming a code implant mask over said word-line layer, and ion implanting through said code implant mask into said device.

* * * * *